United States Patent
Chang et al.

(10) Patent No.: US 11,854,643 B2
(45) Date of Patent: Dec. 26, 2023

(54) SIGNAL PROCESSING SYSTEM CAPABLE OF PERFORMING VOLTAGE AND FREQUENCY CALIBRATION

(71) Applicant: Realtek Semiconductor Corp., HsinChu (TW)

(72) Inventors: Cheng-Pin Chang, HsinChu (TW); Tsung-Peng Chuang, HsinChu (TW)

(73) Assignee: Realtek Semiconductor Corp., HsinChu (TW)

(*) Notice: Subject to any disclaimer, the term of this patent is extended or adjusted under 35 U.S.C. 154(b) by 419 days.

(21) Appl. No.: 17/321,484

(22) Filed: May 16, 2021

(65) Prior Publication Data
US 2021/0365097 A1    Nov. 25, 2021

(30) Foreign Application Priority Data
May 20, 2020  (TW) ................................ 109116684

(51) Int. Cl.
G11C 29/50     (2006.01)

(52) U.S. Cl.
CPC ............... *G11C 29/50004* (2013.01); *G11C 2029/5004* (2013.01)

(58) Field of Classification Search
CPC ............. G06F 1/324; G11C 29/50004; G11C 2029/5004

USPC ........................................................... 702/85
See application file for complete search history.

(56) References Cited

U.S. PATENT DOCUMENTS 8,341,475 B2 * 12/2012 Bancel ................... G06F 21/71
                                                          714/732
10,018,673 B2    7/2018 Kurosawa

FOREIGN PATENT DOCUMENTS

TW         I309043         4/2009

* cited by examiner

*Primary Examiner* — John H Le
(74) *Attorney, Agent, or Firm* — Winston Hsu

(57) ABSTRACT

A signal processing system includes a digital signal processing circuit, a power management unit, and a digital control circuit. The power management unit provides a first voltage to the digital signal processing circuit. When in a calibration mode the digital control circuit controls the power management unit to set the first voltage at a minimum preset value, controls the digital signal processing circuit to operate under a first calibration target frequency, triggers the digital signal processing circuit to perform a built-in self-test, raises the first voltage when the built-in self-test fails, triggers the digital signal processing circuit to perform the built-in self-test again, and stores the first calibration target frequency and a value of the first voltage corresponding to the first calibration target frequency to a non-volatile memory when the built-in self-test has succeeded.

15 Claims, 3 Drawing Sheets

SIGNAL PROCESSING SYSTEM CAPABLE OF PERFORMING VOLTAGE AND FREQUENCY CALIBRATION

BACKGROUND OF THE INVENTION

1. Field of the Invention

The present invention is related to a signal processing system, and more particularly to a signal processing system capable of performing the voltage and frequency calibration.

2. Description of the Prior Art

Since multimedia applications are widely used in different fields, the requirements for the quality of multimedia applications also become higher. The multimedia applications, such as images and sound effects, often involve a large number of complex and repetitive calculations; therefore, the computing power of a digital signal processor is often required to present images and sounds in real-time.

Generally, the maximum operating frequency that a digital signal processor can achieve is related to the power supply voltage it receives. For example, when the digital signal processor receives a voltage of 1.1V, the highest operating frequency of the digital signal processor may be 200 MHz, but when the digital signal processor receives a voltage of 1.2V, the highest operating frequency of the digital signal processor may be increased to 300 MHz. Therefore, to ensure that the digital signal processor can receive the suitable voltage and operate under the desired operating frequency, the manufacturer of the digital signal processor will store the values of the suitable voltages for different operating frequencies before shipment. Consequently, the user can have the digital signal processor operate in the desired frequencies according to the stored voltage values. However, different digital signal processors may have different characteristics due to the uncontrollable variation caused in the manufacturing processes. Therefore, the corresponding relationship between operating frequencies and voltages for each digital signal processor may be different. Furthermore, power management units used to provide power supply voltages may also have different characteristics, making the testing process even more complicate.

SUMMARY OF THE INVENTION

One embodiment of the present invention discloses a signal processing system. The signal processing system includes a digital signal processing circuit, a power management unit, and a digital control circuit.

The power management unit is coupled to the digital signal processing circuit and provides a first voltage to the digital signal processing circuit. The digital control circuit is coupled to the digital signal processing circuit and the power management unit. The digital control circuit includes a non-volatile memory.

When in a calibration mode, the digital control circuit controls the power management unit to set the first voltage at a minimum preset value, controls the digital signal processing circuit to operate under a first calibration target frequency, triggers the digital signal processing circuit to perform a built-in self-test, raises the first voltage when the built-in self-test fails, triggers the digital signal processing circuit to perform the built-in self-test again, and stores the first calibration target frequency and a value of the first voltage corresponding to the first calibration target frequency to the non-volatile memory when the built-in self-test has succeeded.

Another embodiment of the present invention discloses a method for operating a signal processing system. The signal processing system includes a digital signal processing circuit, a power management unit, and a digital control circuit. The digital control circuit includes a non-volatile memory.

The method includes, in a calibration mode, the digital control circuit controlling the power management unit to output a first voltage at a minimum preset value to the digital signal processing circuit, the digital control circuit controlling the digital signal processing circuit to operate under a first calibration target frequency, the digital control circuit triggering the digital signal processing circuit to perform a built-in self-test, the digital control circuit controlling the power management unit to raise the first voltage when the built-in self-test fails, the digital control circuit triggering the digital signal processing circuit to perform the built-in self-test again, and the digital control circuit storing the first calibration target frequency and a value of the first voltage corresponding to the first calibration target frequency to the non-volatile memory when the built-in self-test has succeeded.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
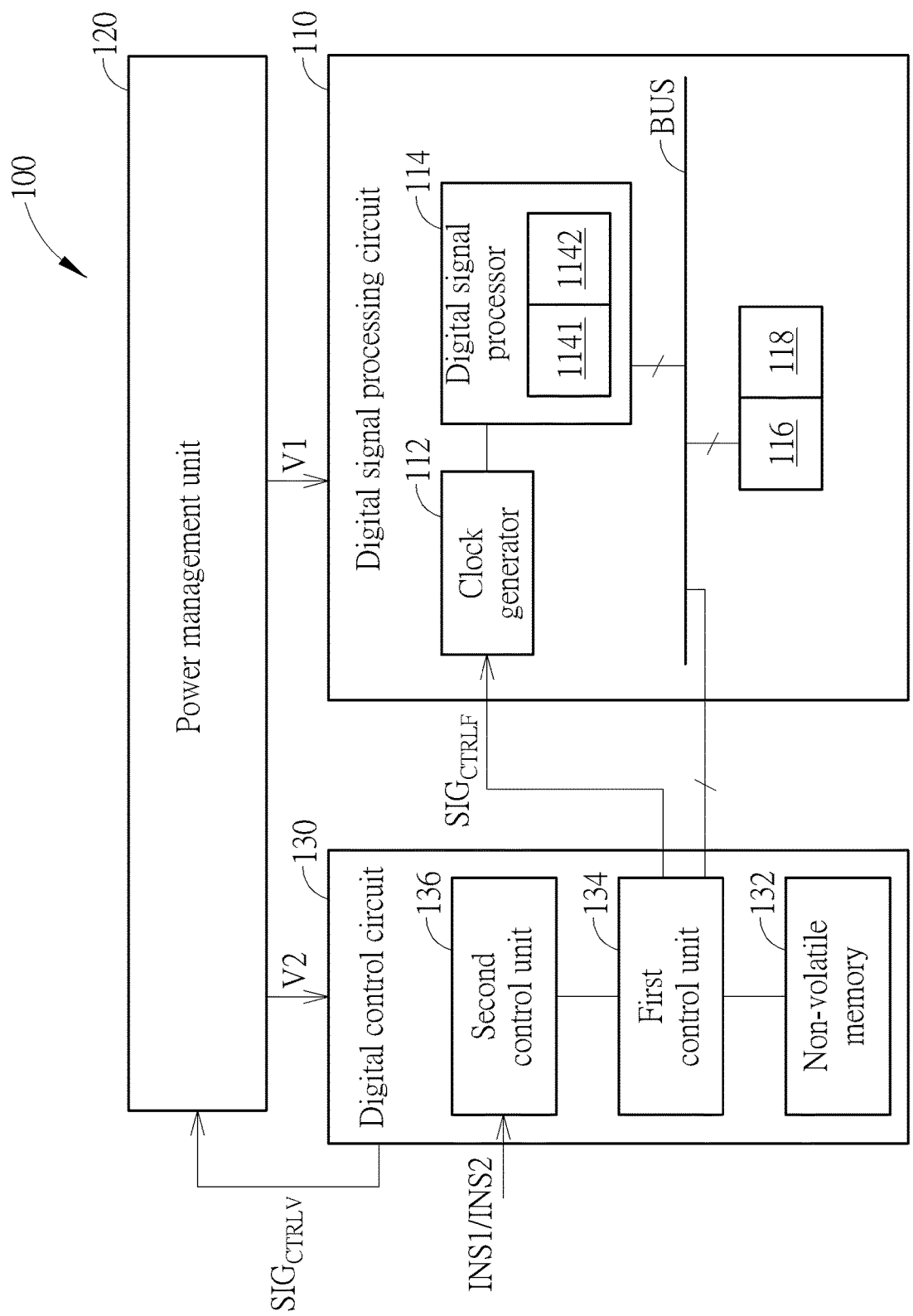
FIG. 1 shows a signal processing system according to one embodiment of the present invention.

FIG. 1 shows a signal processing system 100 according to one embodiment of the present invention. The signal processing system 100 includes a digital signal processing circuit 110, a power management unit 120, and a digital control circuit 130.

The power management unit 120 can be coupled to the digital signal processing circuit 110 and can provide a first voltage V1 to the digital signal processing circuit 110 as a power supply. In addition, the power management unit 120 can also be coupled to the digital control circuit 130, and can provide a second voltage V2 to the digital control circuit 130 as a power supply.

The digital control circuit 130 can be coupled to the digital signal processing circuit 110 and the power management unit 120. In some embodiments, the digital control circuit 130 can control the value of the first voltage V1 outputted by the power management unit 120. That is, the digital control circuit 130 can control the value of the voltage received by the digital signal processing circuit 110. In addition, the digital control circuit 130 can be used to control the operating frequency of the digital signal processing circuit 110. For example, the digital control circuit 130 can be coupled to a clock generator 112 of the digital signal processing circuit 110 and can control the clock generator 112 to generate a clock signal having the desired operating frequency. Consequently, the digital signal processor 114 of the digital signal processing circuit 110 can perform operations according to the clock signal generated by the clock generator 112.

In some embodiments, the digital control circuit 130 can be used to calibrate the voltage corresponding to the desired operating frequency of the digital signal processing circuit 110. The digital control circuit 130 can include a non-voltage memory 132, and can store the operating frequencies and the calibrated voltage values corresponding to the operating frequencies to the non-volatile memory 132. Consequently, later in the practical application mode, the value of the voltage corresponding to the target operating frequency can be read from the non-volatile memory 132, so the digital signal processing circuit 110 can function normally under the target frequency. In some embodiments, the non-volatile memory 132 can be a one-time programmable (OTP) non-volatile memory so the user will not overwrite the recorded voltage values in the non-volatile memory 132 unintentionally. However, the present invention does not limit the non-volatile memory 132 to be an OTP memory. In some other embodiments, the non-volatile memory 132 can be a multiple-time programmable non-volatile memory.

Figure 2:
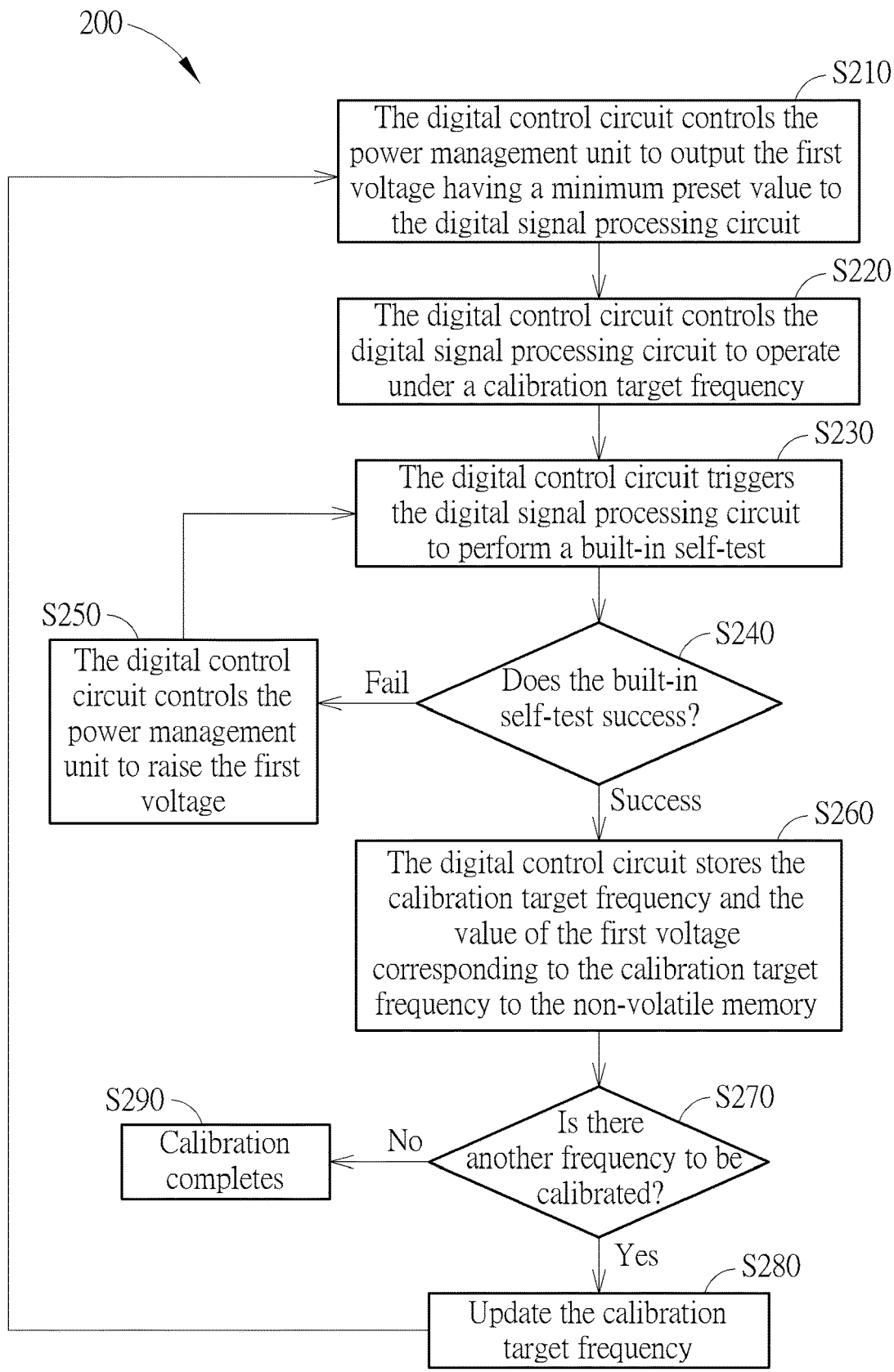
FIG. 2 shows a flowchart of a method for operating the signal processing system in FIG. 1 in a calibration mode.

FIG. 2 shows a flowchart of a method 200 for operating the signal processing system 100 in a calibration mode. In the calibration mode, the method 200 can include steps S210 to S290.

S210: the digital control circuit 130 controls the power management unit 120 to output the first voltage V1 having a minimum preset value to the digital signal processing circuit 110;

S220: the digital control circuit 130 controls the digital signal processing circuit 110 to operate under a calibration target frequency;

S230: the digital control circuit 130 triggers the digital signal processing circuit 110 to perform a built-in self-test;

S240: if the built-in self-test fails, go to step S250, otherwise go to step S260;

S250: the digital control circuit 130 controls the power management unit 110 to raise the first voltage V1, go to step S230;

S260: the digital control circuit 130 stores the calibration target frequency and the value of the first voltage corresponding to the calibration target frequency to the non-volatile memory 132;

S270: if there's another frequency to be calibrated, go to step S280, else go to step S290;

S280: update the calibration target frequency and go to step S210;

S290: calibration completes.

In step S210, the digital control circuit 130 can control the power management unit 120 to provide the first voltage V1 having the minimum preset value, for example, but not limited to 1V. In step S220, the digital control circuit 130 can control the digital signal processing circuit 110 to operate under the calibration target frequency F1. Later, in step S230, the digital control circuit 130 can further trigger the digital signal processing circuit 110 to perform the built-in self-test (BIST) and determine if the test result has succeeded in step S240.

For example, the digital control circuit 130 can further include a first control unit 134. The first control unit 134 can be coupled to the digital signal processing circuit 110 and a power management unit 120. The first control unit 134 can output the voltage control signal $SIG_{CTRLV}$ to the power management unit 120 to adjust the value of the first voltage V1, and can output the frequency control signal $SIG_{CTRLF}$ to the clock generator 112 of the digital signal processing circuit 110 to control the operating frequency of the digital signal processing circuit 110. Afterward, the digital control circuit 130 can determine the result of the BIST and see if the test has passed or failed.

In FIG. 1, the digital signal processor 114 of the digital signal processing circuit 110 can include an internal dynamic random access memory 1141 and a built-in self-test unit 1142. When the digital signal processor 114 performs the calculations, the internal dynamic random access memory 1141 can be used to store the information required during the process of the calculation. The built-in self-test unit 1142 can be coupled to the internal dynamic random access memory 1141. In some embodiments, the digital control circuit 130 can trigger the built-in self-test unit 1142 to perform the built-in self-test. In this case, the built-in self-test unit 1142 can read the data stored in the internal dynamic random access memory 1141 and transmit the data to the digital control circuit 130 so that the digital control circuit 130 can determine if the digital signal processing circuit 110 has passed or failed the built-in self-test.

Furthermore, in FIG. 1, the digital signal processing circuit 110 can further include a static random access memory 116 and a built-in self-test unit 118. The static random access memory 116 can be coupled to the digital signal processor 114 through buses BUS, and can be used to store data of greater sizes that are required for the calculations. The built-in self-test unit 118 can be coupled to the static random access memory 116. In this case, the digital control circuit 130 can trigger the built-in self-test unit 118 to perform the built-in self-test. That is, in step S230, the digital control circuit 130 can trigger the built-in self-test units 1142 and 118 to view the data stored in the internal dynamic random access memory 1141 and the static random access memory 116, and determine the test results accordingly.

In step S240, if the result of the built-in self-test of the digital signal processing circuit 110 turns out to have failed, it may imply that the first voltage V1 is not high enough for the digital signal processing circuit 110 to function normally under the calibration target frequency F1. Therefore, in step S250, the digital control circuit 130 can control the power management unit 120 to raise the value of the first voltage V1, and step S230 can be performed again to trigger the digital signal processing circuit 110 and perform the built-in self-test. Consequently, before the digital signal processing circuit 110 can pass the built-in self-test, the first voltage V1 will increase gradually. In some embodiments, the first voltage V1 can be added with a fixed value, for example, but not limited to 0.05V, whenever step S250 is performed. However, the embodiment is not limited thereto.

When the digital signal processing circuit 110 passes the built-in self-test, it may imply that the first voltage V1 is high enough for the digital signal processing circuit 110 to function normally under the calibration target frequency F1. In this case, the digital control circuit 130 can store the calibration target frequency F1 and the value of the first voltage V1 corresponding to the calibration target frequency F1 to the non-volatile memory 132.

In step S270, if there is another operating frequency to be calibrated, the calibration target frequency F1 can be updated as a next calibration target frequency F2 in step S280. Next, step S210 can be performed again, and the first voltage V1 will be reset to the minimum preset value. Also, the digital control circuit 130 can control the digital signal processing circuit 110 to operate under the calibration target frequency F2, and trigger the digital signal processing circuit 110 to perform the built-in self-test. Afterward, the aforesaid operations can be repeated until the digital signal processing circuit 110 passes the built-in self-test, and the calibration target frequency F2 and the value of the first voltage V1 corresponding to the calibration target frequency F2 can be stored in the non-volatile memory 132.

Consequently, with the method 200, the values of the first voltage V1 required for different operating frequencies can be calibrated in the calibration mode. The digital control circuit 130 can control the power management unit 120 to increase the first voltage V1 for seeking the proper voltage value required for the digital signal processing circuit 110 to operate under the target operating frequency; therefore, the proper voltage value suitable for each of the digital signal processing circuits 110 in different signal processing systems 100 can be found even if the digital signal processing circuits 110 and the power management units 120 have different characteristics due to the manufacturing process variation. In addition, since the operating frequencies and the values of the first voltage corresponding to the operating frequencies can be stored in the non-volatile memory 132, the record can be preserved even after the system power down, so the signal processing system 100 can access the corresponding voltage values repeatedly.

Figure 3:
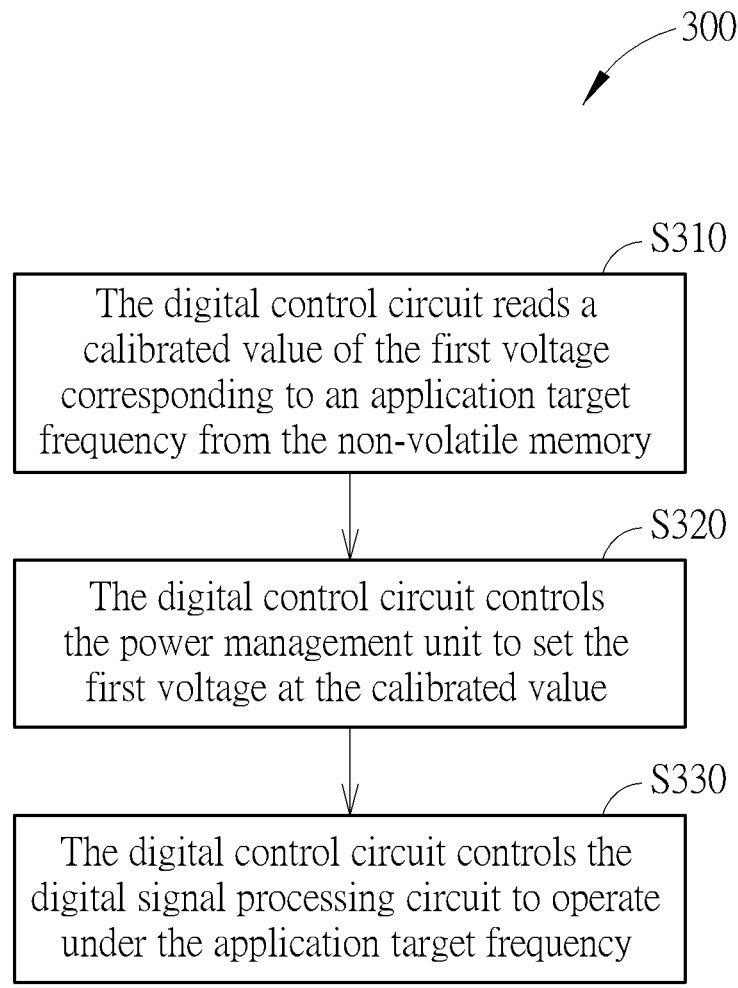
FIG. 3 shows a flowchart of a method for operating the signal processing system in FIG. 1 in an application mode.

FIG. 3 shows a flowchart of a method 300 for operating the signal processing system 100 in an application mode. In the application mode, the method 300 can include steps S310 to S330.

S310: the digital control circuit 130 reads a calibrated value of the first voltage V1 corresponding to an application target frequency from the non-volatile memory 132;

S320: the digital control circuit 130 controls the power management unit 120 to set the first voltage V1 at the calibrated value; and S330: the digital control circuit 130 controls the digital signal processing circuit 110 to operate under the application target frequency.

That is, in the application mode, after the user determines the application target frequency of the digital signal processing circuit 110, the digital control circuit 130 can read the calibrated value of the first voltage V1 corresponding to the application target frequency from the non-volatile memory 132 in step S310, and control the power management unit 120 to output the first voltage V1 having the calibrated value. Consequently, the digital signal processing circuit 110 can be operated under the application target frequency normally in step S33.

In FIG. 1, the digital control circuit 130 can further include a second control unit 136. The second control unit 136 can be coupled to the first control unit 134. The second control unit 136 can receive the system instructions and have the first control unit 134 be switched between the calibration mode and the application mode. For example, when the second control unit 136 receives the system instruction INS1, the second control unit 136 can have the first control unit 134 enter the calibration mode according to the system instruction INS1 and set the calibration target frequency F1. Also, when the second control unit 136 receives the system instruction INS2, the second control unit 136 can have the first control unit 134 enter the application mode according to the system instruction INS2 and set the application target frequency.

In FIG. 1, the digital control circuit 130 can include two control units 134 and 136 for controlling different circuits. However, in some other embodiments, the digital control circuit 130 can also use one control unit to perform the required operations according to the system requirement.

In summary, the signal processing systems and the methods for operating the signal processing system provided by the embodiments of the present invention can calibrate the voltage values corresponding to different operating frequencies; therefore, the digital signal processing circuit can receive the proper voltage and operate under the desired frequency normally. In addition, since the signal processing systems can adjust the values of the voltages outputted by the power management units gradually in the calibration mode, the proper voltage value suitable for each of the signal processing systems can be found even if the signal processing systems have different characteristics due to the manufacturing process variation. Consequently, the calibration process can be simplified, and the digital signal processing circuit would be able to operate under the desired frequencies normally, thereby improving the yield rate of the signal processing system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing system comprising:
a digital signal processing circuit;
a power management unit coupled to the digital signal processing circuit and configured to provide a first voltage to the digital signal processing circuit; and
a digital control circuit coupled to the digital signal processing circuit and the power management unit, and comprising a non-volatile memory, the digital control circuit being configured to, when in a calibration mode:
control the power management unit to set the first voltage at a minimum preset value;
control the digital signal processing circuit to operate under a first calibration target frequency;
trigger the digital signal processing circuit to perform a built-in self-test;
raise the first voltage when the built-in self-test fails;
trigger the digital signal processing circuit to perform the built-in self-test again; and
store the first calibration target frequency and a value of the first voltage corresponding to the first calibration target frequency to the non-volatile memory when the built-in self-test has succeeded.

2. The signal processing system of claim 1, wherein the digital control circuit is further configured to, when in an application mode:
read a calibrated value of the first voltage corresponding to an application target frequency from the non-volatile memory;
control the power management unit to set the first voltage at the calibrated value; and
control the digital signal processing circuit to operate under the application target frequency.

3. The signal processing system of claim 1, wherein the digital control circuit further comprises:
a first control unit coupled to the digital signal processing circuit and the power management unit, and configure to output a voltage control signal to the power management unit to adjust the first voltage, output a frequency control signal to a clock generator of the digital signal processing circuit to control an operating frequency of the digital signal processing circuit, and determine a result of the built-in self-test; and
a second control unit coupled to the first control unit, and configured to have the first control unit enter the calibration mode and set the first calibration target frequency corresponding to the calibration mode according to a first system instruction, and have the first control unit enter an application mode and set an application target frequency corresponding to the application mode.

4. The signal processing system of claim 1, wherein the power management unit is further configured to provide a second voltage to the digital control circuit as a power supply.

5. The signal processing system of claim 1, wherein the digital signal processing circuit further comprises a digital signal processor comprising an internal dynamic random access memory and a first built-in self-test unit, wherein:
the first built-in self-test unit is coupled to the internal dynamic random access memory; and
the digital signal processing circuit at least triggers the first built-in self-test unit to perform the built-in self-test.

6. The signal processing system of claim 5, wherein the digital signal processing circuit further comprises a static random access memory and a second built-in self-test unit, wherein:
the second built-in self-test unit is coupled to the static random access memory; and
the digital signal processing circuit triggers the first built-in self-test unit and the second built-in self-test unit to perform the built-in self-test.

7. The signal processing system of claim 1, wherein the non-volatile memory is a one-time programmable (OTP) non-volatile memory.

8. The signal processing system of claim 1, wherein the digital control circuit is further configured to, after the first calibration target frequency and the value of the first voltage corresponding to the first calibration target frequency are stored to the non-volatile memory in the calibration mode:
control the power management unit to set the first voltage at the minimum preset value;
control the digital signal processing circuit to operate under a second calibration target frequency;
trigger the digital signal processing circuit to perform the built-in self-test;
raise the first voltage when the built-in self-test fails;
trigger the digital signal processing circuit to perform the built-in self-test again; and
store the second calibration target frequency and a value of the first voltage corresponding to the second calibration target frequency to the non-volatile memory when the built-in self-test has succeeded.

9. A method for operating a signal processing system, the signal processing system comprising a digital signal processing circuit, a power management unit, and a digital control circuit comprising a non-volatile memory, the method comprising, in a calibration mode:
the digital control circuit controlling the power management unit to output a first voltage at a minimum preset value to the digital signal processing circuit;
the digital control circuit controlling the digital signal processing circuit to operate under a first calibration target frequency;
the digital control circuit triggering the digital signal processing circuit to perform a built-in self-test;
the digital control circuit controlling the power management unit to raise the first voltage when the built-in self-test fails;
the digital control circuit triggering the digital signal processing circuit to perform the built-in self-test again; and
the digital control circuit storing the first calibration target frequency and a value of the first voltage corresponding to the first calibration target frequency to the non-volatile memory when the built-in self-test has succeeded.

10. The method of claim 9 further comprising, in an application mode:
the digital control circuit reading a calibrated value of the first voltage corresponding to an application target frequency from the non-volatile memory;
the digital control circuit controlling the power management unit to set the first voltage at the calibrated value; and
the digital control circuit controlling the digital signal processing circuit to operate under the application target frequency.

11. The method of claim 9, further comprising the power management unit providing a second voltage to the digital control circuit as a power supply.

12. The method of claim 9, wherein:
the digital signal processing circuit further comprises a digital signal processor comprising an internal dynamic random access memory and a first built-in self-test unit, the first built-in self-test unit being coupled to the internal dynamic random access memory; and
the digital control circuit triggering the digital signal processing circuit to perform the built-in self-test comprises the digital signal processing circuit triggering the first built-in self-test unit.

13. The method of claim 12, wherein:
the digital signal processing circuit further comprises a static random access memory and a second built-in self-test unit, and the second built-in self-test unit being coupled to the static random access memory; and
the digital control circuit triggering the digital signal processing circuit to perform the built-in self-test comprises the digital signal processing circuit triggering the first built-in self-test unit and the second built-in self-test unit.

14. The method of claim 9, wherein the non-volatile memory is a one-time programmable (OTP) non-volatile memory.

15. The method of claim 9 further comprising in the calibration mode, after the digital control circuit stores the first calibration target frequency and the value of the first voltage corresponding to the first calibration target frequency to the non-volatile memory:
the digital control circuit controlling the power management unit to set the first voltage at the minimum preset value;
the digital control circuit controlling the digital signal processing circuit to operate under a second calibration target frequency;
the digital control circuit triggering the digital signal processing circuit to perform the built-in self-test;
the digital control circuit controlling the power management unit to raise the first voltage when the built-in self-test fails;
the digital control circuit triggering the digital signal processing circuit to perform the built-in self-test again; and the digital control circuit storing the second calibration target frequency and a value of the first voltage corresponding to the second calibration target frequency to the non-volatile memory when the built-in self-test has succeeded.

* * * * *